United States Patent [19]

Takahashi et al.

[11] 4,398,457
[45] Aug. 16, 1983

[54] MARKING APPARATUS FOR PLASTIC ENCAPSULATED SEMICONDUCTOR DEVICES

[75] Inventors: Fumio Takahashi; Yuji Miura, both of Yokohama, Japan

[73] Assignee: Tokyo Shibaura Denki Kabushiki Kaisha, Kawasaki, Japan

[21] Appl. No.: 276,531

[22] Filed: Jun. 23, 1981

[30] Foreign Application Priority Data

Jun. 30, 1980 [JP] Japan .................. 55-87747

[51] Int. Cl.³ .................................. B41F 17/00
[52] U.S. Cl. ................................. 101/44; 264/80
[58] Field of Search .................. 101/44, 43, 41, 40, 101/38 R, 38 A, 39, 35, 126; 264/80, 132, 272.17; 432/229, 231; 266/72

[56] References Cited

U.S. PATENT DOCUMENTS

| | | | |
|---|---|---|---|
| 2,648,097 | 8/1953 | Kritchever | 264/80 X |
| 2,746,084 | 5/1956 | Kreidl | 264/80 X |
| 2,795,820 | 6/1957 | Grow et al. | 264/80 |
| 2,802,412 | 8/1957 | Lecluyse et al. | 264/80 X |
| 3,090,296 | 5/1963 | Pechmann | 101/44 |
| 3,225,689 | 12/1965 | Fuchs, Jr. et al. | 101/44 |
| 3,266,417 | 8/1966 | Evers | 101/41 |
| 3,267,842 | 8/1966 | Resnick et al. | 101/40 |
| 3,424,082 | 1/1969 | Gray, Jr. | 101/40 |
| 3,933,091 | 1/1976 | Von Saspe | 101/40 |
| 4,048,916 | 9/1977 | Silverman et al. | 101/40 |
| 4,091,726 | 5/1978 | Walker | 101/126 X |

FOREIGN PATENT DOCUMENTS 54-140463 10/1979 Japan .

Primary Examiner—Clifford D. Crowder
Attorney, Agent, or Firm—Finnegan, Henderson, Farabow, Garrett & Dunner

[57] ABSTRACT

A marking apparatus is for marking at least one plastics encapsulated semiconductor device with marking-obstructive substances thereon. The marking apparatus comprises a conveying mechanism for conveying the semiconductor device, a pretreatment mechanism for removing the marking-obstructive substances on the semiconductor device conveyed thereto by the conveying mechanism, a stamping mechanism for stamping a mark on the semiconductor device removed of the marking-obstructive substances by the pretreatment mechanism and transferred thereto by the conveying mechanism, and a fixing mechanism for fixing the mark stamped on the semiconductor device transferred thereto by the conveying mechanism.

3 Claims, 11 Drawing Figures

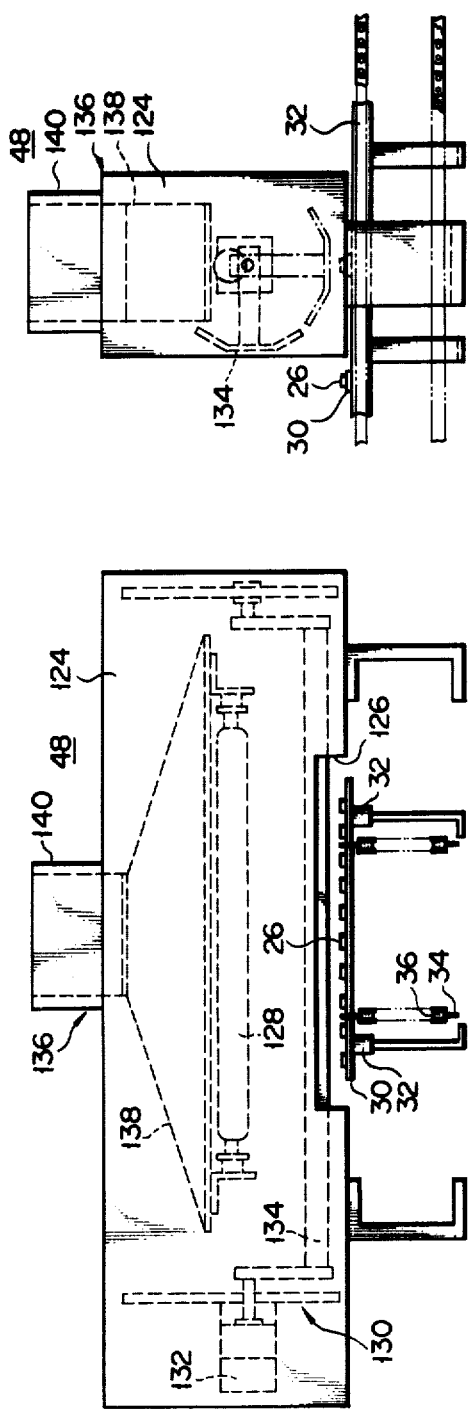

MARKING APPARATUS FOR PLASTIC ENCAPSULATED SEMICONDUCTOR DEVICES

BACKGROUND OF THE INVENTION

This invention relates to a marking apparatus for marking the surface of a device for discrimination, more specifically to a marking apparatus for stamping a mark on the surface of a plastic encapsulated semiconductor device.

Generally, the surface of a plastic encapsulated semiconductor device carries oils and fats or oozes with a mold release agent. In particular, a mold release agent is commonly used in plastic encapsulation to facilitate release of a plastic encapsulated semiconductor device from a mold. The surface of such a plastic encapsulated semiconductor device must be stamped with a mark for discrimination. In such stamping, however, oils, fats, or mold release agents act as marking-obstructive substances which, if remaining on the surface of the device, will destroy satisfactory stamping conditions.

Conventionally, therefore, a pretreatment process for removing the oils, fats, or mold release agents from the surface of the device is executed before the stamping process. In the pretreatment process, as shown in FIG. 1 for example, an abrasive 16 is blown against the plastic surface 12 of a semiconductor device 10 to be stamped by means of a honing nozzle 14, and the surface 12 is cleaned to remove oils, fats or mold release agents. Alternatively, in this pretreatment process, the plastic surface 12 is cleaned to remove the oils, fats, or mold release agents by means of cloth or cotton 20 impregnated with an organic solvent 18, as shown in FIG. 2.

In the pretreatment process, moreover, cleaned semiconductor devices 10 are manually set in a marking apparatus one by one. Therefore, the conventional system is extremely low in productivity, and hence suffers from the problem of high cost of products.

SUMMARY OF THE INVENTION

It is, therefore, a main object of the present invention to provide a marking apparatus which overcomes the above-mentioned drawbacks, specifically that is, a marking apparatus capable of performing pretreatment, stamping and fixing in a series of processes, thereby ensuring rationalized operations and improved productivity, and hence reduced cost of products.

To achieve the objects, and in accordance with the purpose of the invention, as embodied and broadly described herein, the invention comprises a marking apparatus comprising a conveying mechanism for conveying at least one plastic encapsulated semiconductor device, a pretreatment mechanism for removing marking-obstructive substances on the semiconductor device conveyed thereto by the conveying mechanism, a stamping mechanism for stamping a mark on the semiconductor device removed of the marking-obstructive substances by the pretreatment mechanism and transferred thereto by the conveying mechanism, and a curing mechanism for curing the mark stamped on the semiconductor device transferred thereto by the conveying mechanism.

BRIEF DESCRIPTION OF THE DRAWINGS

FIG. 10 is an extractive front view of a fixing mechanism in the marking apparatus; and FIG. 11 is a side view of the fixing mechanism of FIG. 10.

DETAILED DESCRIPTION OF THE PREFERRED EMBODIMENT

Figure 1:
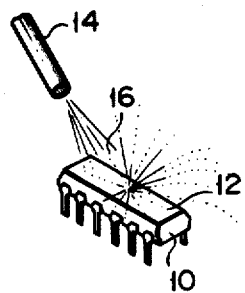
FIGS. 1 and 2 are perspective views severally showing prior art methods of pretreatment.
Figure 2:
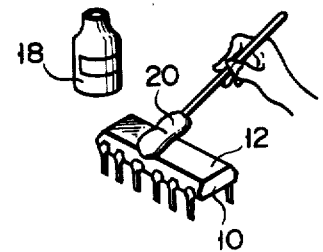

Referring now to the drawings of FIGS. 3 to 11, there will be described in detail one embodiment of a marking apparatus according to this invention.

Figure 3:
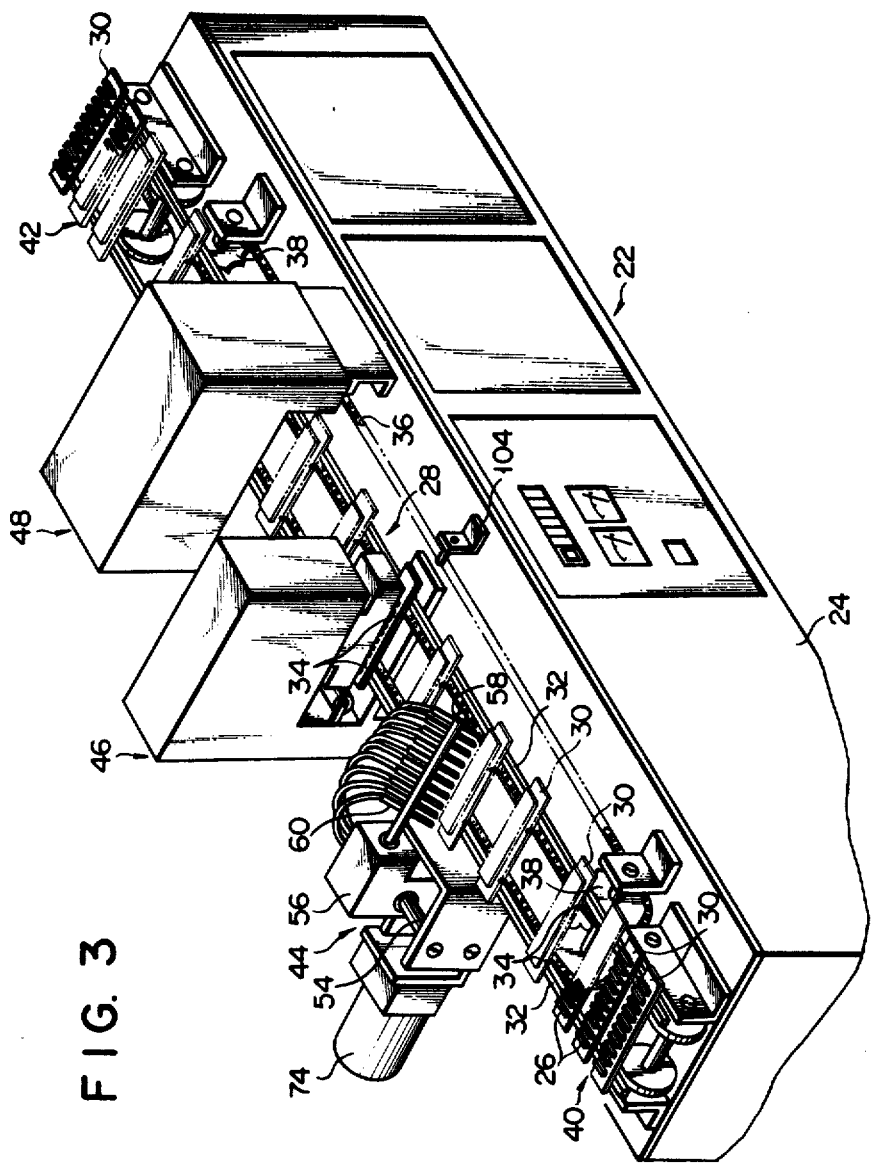
FIG. 3 is a perspective view showing one embodiment of a marking apparatus according to this invention.

As shown in FIG. 3, the marking apparatus 22 is provided with a housing 24. Disposed on the top of the housing 24 is a conveying mechanism 28 which has an intermittent feed function and conveys plastic encapsulated semiconductor devices 26 along the longitudinal axis of the housing 24. The conveying mechanism 28 includes a plurality of carriages 30 each bearing a plurality of, e.g. ten, plastic encapsulated semiconductor devices 26, a pair of guide rails 32 extending along the longitudinal axis of the housing 24 and slidably supporting both end portions of the under surface of each carriage 30, endless chains 36 adjoining the guide rails 32 and having feed pawls 34 which engage the respective rear edges of the carriages 30, and two pairs of sprockets 38 movably supporting the endless chains 36. Among these sprockets 38, supply-side ones are rotatably mounted on pivots, while delivery-side ones are connected to a driving source (not shown) to be driven thereby to rotate. Each carriage 30 is in the form of a rectangular plate and is arranged so that its longitudinal axis intersects that of the housing 24 at right angles thereto. The semiconductor devices 26 are successively arranged at regular intervals on the carriage 30 along the longitudinal axis thereof. The carriages 30 move on the guide rails 32 along the extending direction thereof, engaged with the feed pawls 34 of the endless chains 36 running in accordance with the rotation of the sprockets 38.

A loading section 40 for supplying the conveying mechanism 28 with the semiconductor devices 26 on the carriages 30 to be marked is disposed on that portion of the housing 24 which faces the supply-side of the conveying mechanism 28. An unloading section 42 for delivering the marked semiconductor devices 26 on the carriages 30 to the next process is disposed on that portion of the housing 24 which faces the delivery-side of the conveying mechanism 28.

Over the conveying mechanism 28 on the housing 24 lie a pretreatment mechanism 44, a stamping mechanism 46 and a fixing mechanism 48 which are successively arranged at intervals from the supply-side to the delivery-side.

The semiconductor devices 26 are encapsulated with a plastic material containing a mold release agent (generally consisting of C, H, O, N, etc.) to facilitate release of the devices 26 from molds after encapsulation. Therefore, the plastic encapsulated semiconductor devices 26 are oozing with the mold release agent. The pretreatment mechanism 44, which is used for removing the mold release agent from the surface of the devices 26, is constructed as shown in detail in FIG. 4.

The pretreatment mechanism 44 is provided with a main body 50 fixed on the housing 24 along one of the guide rails 32. Disposed on the supply-side front end edge and the delivery-side rear end edge of the main body 50 are bent strips 52 which extend at right angles to the guide rail 32 to go away therefrom. Two guide shafts 54 are stretched between these bent strips 52 in parallel to the guide rail 32, one lying above the other. A guide member 56 is supported by these two guide shafts 54 so as to be able to slide along the guide rail 32. A support shaft 58 rotatably penetrates the upper portion of the guide member 56, intersecting the two guide rails 32 at right angles thereto. The distal end portion of the support shaft 58 extends beyond the two guide rails 32. A plurality of, e.g. ten, torch nozzles 60 corresponding to the number of semiconductor devices 26 carried on each carriage 30 are fixed to the distal end portion of the support shaft 58 so as to face the semiconductor devices 26. These torch nozzles 60 are connected to a cylinder (not shown) containing hydrogen gas of a high pressure such as about 2 kg/cm$^2$ through a regulator (not shown). The hydrogen gas from the cylinder is supplied to the respective distal ends of the torch nozzles 60. Each torch nozzle 60 has an inside diameter of 0.1 to 0.3 mm, and jets the hydrogen gas at a flow rate of 5 to 10 l/hour. The jetted hydrogen gas is ignited.

On the other hand, the proximal end portion of the support shaft 58 penetrates the guide member 56 to project on the opposite side thereof to the guide rails 32. The proximal end portion of the support shaft 58 is fixedly fitted with the proximal end portion of a holder member 62 which extends in the same direction with the torch nozzles 60. A roller 64 is rotatably mounted on the distal end portion of the holder member 62, having its rotating axis parallel to that of the support shaft 58. A roller guide member 66 is disposed so as to be able to engage the circumferential surface of the roller 64. The roller guide member 66 is fixed to the rear-end-side bent strip 52, extending therefrom along the guide shafts 54. The roller guide member 66 has a top surface and a slant end surface against which the circumferential surface of the roller 64 is to abut. A spring 70 is stretched between the holder member 62 having the roller 64 and a driven member 68 as mentioned later. The spring 70 urges the holder member 62 in a direction to cause the roller 64 to abut against the roller guide member 66.

The pretreatment mechanism 44 is provided with a driving mechanism 72 which drives the guide member 56 to reciprocate along the guide shafts 54. The driving mechanism 72 includes a motor 74 capable of controlling the stop position and having its driving shaft at right angles to the guide rails 32, and a disc cam 76 eccentrically mounted on the driving shaft of the motor 74. An engaging roller 78 is disposed so as to be able to abut against the circumferential surface of the disc cam 76 serving as a cam surface. The engaging roller 78 is rotatably mounted on the substantially middle portion of a mounting lever 80, having its rotating axis parallel to the driving shaft of the motor 74. The lever 80 is rotatably supported on a support shaft 82 which is attached to the lower end portion of the lever 80. A spring 84 is stretched between the upper end portion of the lever 80 and the delivery-side bent strip 52. The spring 84 urges the lever 80 to cause the outer circumferential surface of the engaging roller 78 to abut against the cam surface of the disc cam 76.

A driving roller 86 is rotatably mounted on the upper end portion of the mounting lever 80, having its rotating axis parallel to the driving shaft of the motor 74. The driven member 68 is fixed to the lower portion of the guide member 56, engaging the driving roller 86. The driven member 68 has bent strips 88 on both supply- and delivery-side end edges thereof, respectively. An arcuate movement of the driving roller 86 around the support shaft 82 is transmitted through the driven member 68 to the guide member 56 as a straight alternating motion along the guide shafts 54.

Figure 5:
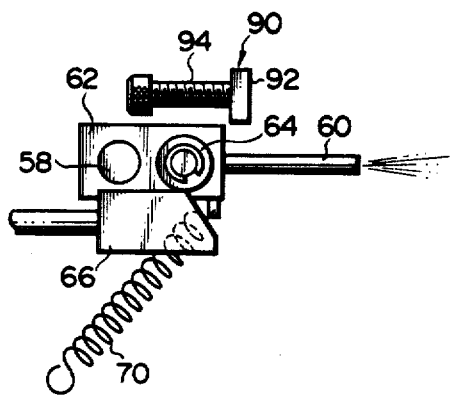
FIGS. 5 to 7 are front views showing varied operating states of the pretreatment mechanism.

When the engaging roller 78 is in contact with that portion of the cam surface which is nearest to the eccentric shaft, the guide member 56 is located on the delivery-side inside the main body 50, and the roller 64 engages the top surface of the roller guide member 66. That is, in this state, the holder member 62 is biased to rock upward, as shown in FIG. 5, so that the torch nozzles 60, fixedly coupled to the holder member 62 by means of the support shaft 58, are also biased to rock upward.

Figure 4:
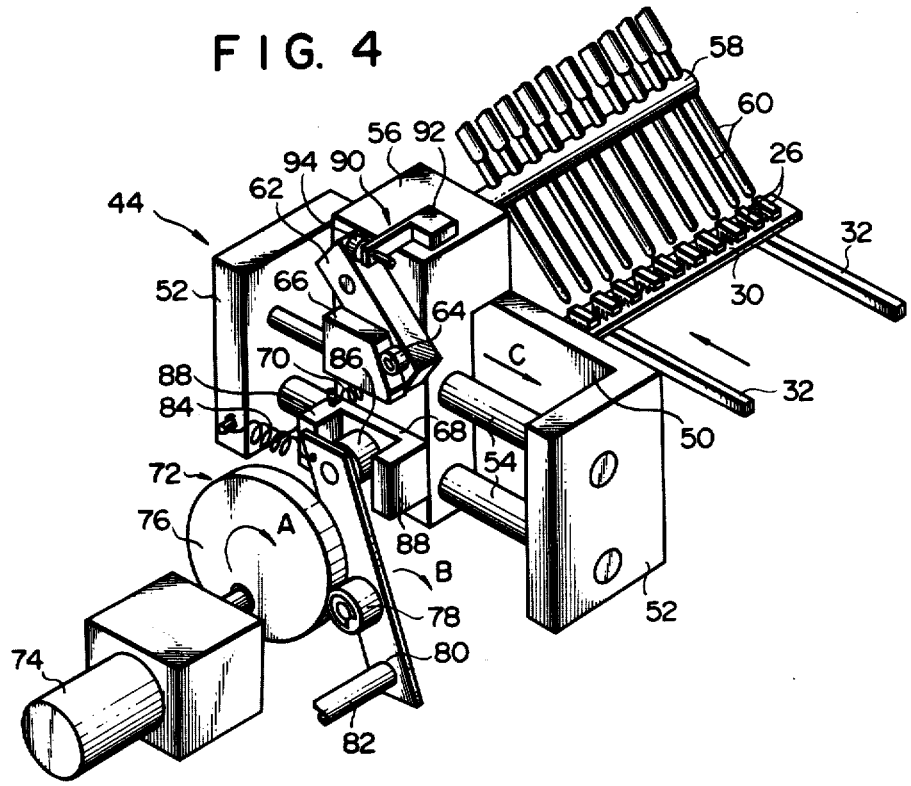
FIG. 4 is an extractive perspective view of a pretreatment mechanism in the marking apparatus.
Figure 6:
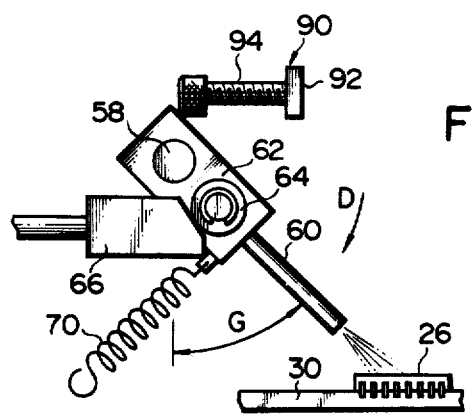

On the other hand, the disc cam 76 is rotated from the aforesaid state in the direction of an arrow A by the drive of the motor 74, and the mounting lever 80 rotates in the direction of an arrow B around the support shaft 82 as the cam surface edges away from the eccentric shaft. Accordingly, the guide member 56 is moved in the direction of an arrow C, i.e. toward the supply-side, by the engagement between the driving roller 86 and the driven member 68, and the roller 64 slides on the top surface of the roller guide member 66 in the direction of the arrow C to slide down along the slant end face by the agency of the urging force of the spring 70. Accompanying such slide down, the holder member 62 rotates in the direction of an arrow D of FIG. 6 around the support shaft 58 and stops at a position where it makes an angle of 45° to the guide rails 32. As shown in FIGS. 4 and 6, moreover, the respective distal ends of the torch nozzles 60 face the delivery-side end portions of the stopped semiconductor devices 26 corresponding thereto. A regulation member 90 is disposed on the top of the guide member 56 to maintain the rocked position of the holder member 62.

The regulation member 90 is fixed on the top of the guide member 56, and includes a mounting member 92 extending to the side on which the holder member 62 is disposed, and a stopper pin 94 attached to the mounting member 92 so as to be able to move along the direction of the arrow C. The stopper pin 94 is screwed in the mounting member 92. That is, the stopper pin 94 moves forward or backward along the direction of the arrow C as against the mounting member 92 as it is rotated on its axis. A predetermined portion of the holder member 62 abuts against the head portion of the stopper pin 94, and the holder member 62 maintains its position against the urging force of the spring 70.

When the disc cam 76 rotates in the direction of the arrow A and the engaging roller 78 is in contact with that portion of the cam surface which is farthest from the eccentric shaft, on the other hand, the guide member 56 is located on the supply-side inside the main body 50, and the holder member 62 is in contact with the stopper pin 94 of the regulation member 90, with the roller 64 disengaged from the slant end face of the roller guide member 66. That is, in this state, the distal end of each torch nozzle 60 faces the supply-side end portion of its corresponding stopped semiconductor device 26.

Hereupon, the distal end of each torch nozzle 60 is approximately 10 mm distant from the surface of the semiconductor device 26 when the torch nozzle 60 is at an angle of 45° to the semiconductor device 26. Further, the speed of reciprocation, i.e. burning speed, of the torch nozzles 60 accompanying the reciprocation of the guide member 56 caused by the rotation of the disc cam 76 is set at 5 to 40 mm/sec. In this case, the width to be covered by the pretreatment with each flame is 5 to 10 mm, and the temperature obtained is 600° to 800° C.

Now there will be described the stamping mechanism 46 for stamping the pretreated semiconductor devices 26.

Figure 9:
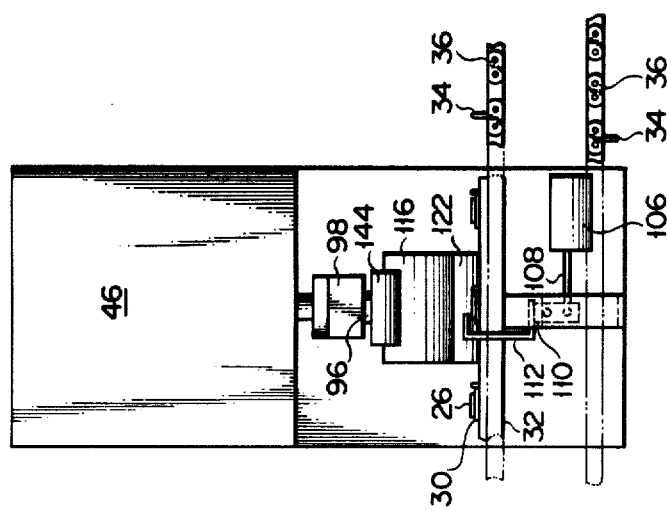
FIG. 9 is a side view of the stamping mechanism of FIG. 8.
Figure 8:
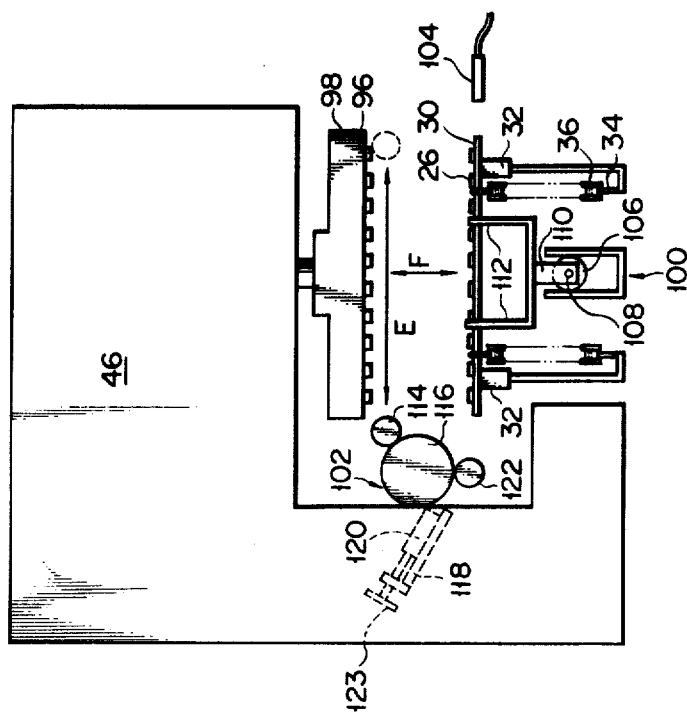
FIG. 8 is an extractive front view of a stamping mechanism in the marking apparatus.

As shown in FIGS. 8 and 9, the stamping mechanism 46 is provided with a marking head 98 having rubber stamps 96 for stamping their corresponding pretreated semiconductor devices 26 with predetermined marks, and an ink supply mechanism 102 for supplying a predetermined amount of ink to the surface of each rubber stamp 96. The conveying mechanism 28 is provided with a positioning mechanism 100 to face the stamping mechanism 46. The positioning mechanism 100 includes a detector 104 for detecting the transfer of the semiconductor devices 26 to their respective predetermined positions, an electric-powered cylinder 106 to start operation in response to a detection signal produced on detection of the predetermined positions, and a locating lever 110 having one end coupled to a driving shaft 108 of the electric-powered cylinder 106 and rotatably mounted at the substantially middle portion thereof. The driving shaft 108 is designed so as to project outward from the cylinder 106 when it receives the detection signal from the detector 104. The distal end portion of the locating lever 110 has two engagement portions 112 which are arranged in parallel with each other and at right angles to the extending direction of the guide rails 32. Each engagement portion 112 allows the movement of the carriages 30 when no detection signal is delivered from the detector 104. When the detection signal is delivered, each engagement portion 112 is actuated by the driving shaft 108 to place the carriage 30 in the predetermined position. The distal end of each engagement portion 112 is bent so as to be located over its corresponding carriage 30 when the engagement portion 112 is in the predetermined position. The stoppage time of the conveying mechanism 28 controlled by the stop mechanism (not shown) is approximately 9 seconds.

The ink supply mechanism 102 is provided with a rotatable ink roller 114 which can be moved, by a driving mechanism (not shown), along the direction of an arrow E to supply ink to the surface of each rubber stamp 96 in response to the detection signal from the detector 104. The ink roller 114 is in rolling contact with a feed roller 116 for uniformly supplying ink to the ink roller 114. The feed roller 116 is provided with a blade 120 which is movably mounted on a blade mounting plate 118 so that the gap between the blade 120 and the feed roller 116 can be adjusted by means of an adjust screw 123. As the gap is adjusted, the ink supplied to the feed roller 116 is spread by the blade 120 in accordance with the rotation of the feed roller 116, and is attached to the surface of the feed roller 116 with an ink thickness equivalent to the width of the gap. Further, the feed roller 116 is provided with an oscillating roller 122 for axially spreading the ink with the predetermined thickness sticking to the surface of the feed roller 116. The oscillating roller 122 is oscillated by a cam mechanism (not shown).

After the ink has fully put on all the rubber stamps 96, the marking head 98 is lowered by a driving mechanism (not shown) until the rubber stamps 96 come into contact with the surfaces of their corresponding pretreated semiconductor devices 26 on the carriages 30 now not moving. After the passage of a time required for the application of the ink on the rubber stamps 96 to the surfaces of the semiconductor devices 26, the marking head 98 is raised by the aforesaid driving mechanism to be returned to its original position.

Here the ink used for the stamping of the semiconductor devices 26 is UV ink No. 9040 (white) manufactured by MARKEM CO. The UV ink hardens if ultraviolet rays are applied to it for at least 5 seconds.

Now there will be described the fixing mechanism 48 for fixing the ink stamped on the surfaces of the semiconductor devices 26.

As shown in FIGS. 10 and 11, the fixing mechanism 48 is provided with a main body 124 which is mounted on the top of the housing 24 so as to straddle the conveying mechanism 28. The under surface of the main body 124 has an opening 126 capable of facing the carriages 30. Inside the main body 124, there are provided a mercury lamp 128 which applies ultraviolet rays through the opening 126 to the semiconductor devices 26 carried on the carriages 30 and having reached the position to face the opening 126, and a shutter mechanism 130 for closing the opening 126 as required. For the mercury lamp 128, a lamp manufactured by TOSHIBA ELECTRIC EQUIPMENT CORPORATION and rated for H 2,000 L/6, 80 W/cm is used.

In the aforementioned stamping mechanism 46, the feed pawls 34 are arranged on the endless chains 36 so that, when the conveying mechanism 28 is not actuated by the stop mechanism to maintain pretreated semiconductor devices 26 on one carriage 30 in their respective predetermined positions for stamping, semiconductor devices 26 to be pretreated may be maintained in their respective predetermined positions for pretreatment by the pretreatment mechanism 44, and that stamped semiconductor devices to be fixed may be maintained in their respective predetermined positions for fixing by the fixing mechanism 48.

The shutter mechanism 130 is provided with a reversible motor 132 and a shutter screen 134 coupled to the motor 132 to be driven thereby. When the marking apparatus 22 is operating normally, the shutter screen 134, as indicated by a broken line shown in FIG. 11, is biased to a position to open the opening 126. If the marking apparatus 22 is not in normal operation, e.g., if the positioning mechanism 100 goes wrong to prolong the stop state, then the shutter screen 134, as indicated by a one dot dash line shown in FIG. 11, will be moved by the motor 132 to a position to close the opening 126. The closure of the opening 126 prevents the semiconductor devices facing the fixing mechanism 48 from being heated to be broken by heat rays applied together with the ultraviolet rays from the mercury lamp 128. Thereafter, when the marking apparatus 22 is restored to its normal operating state, the shutter screen 134 is moved by the reverse rotation of the motor 132 to the position to open the opening 126.

Disposed inside the fixer body 124 is a ventilating mechanism 136 for ventilating the fixer body 124. The ventilating mechanism 136 includes a duct 138 located over the mercury lamp 128 and a blower 140 coupled with the duct 138. When the ventilating mechanism 136 operates, ozone and heat produced by lighting the mercury lamp 128 are discharged from the fixer body 124.

Now there will be described the operation of the marking apparatus 22 of the above-mentioned construction.

A carriage 30 bearing semiconductor devices 26 and transferred from the preceding process through the loading section 40 is supported on the pair of guide rails 32 of the conveying mechanism 28. The carriage 30 is transferred on the guide rails 32 to the pretreatment mechanism 44 by the feed pawls 34 of the endless chains 36 as the endless chains 36 intermittently run.

The moment the carriage 30 reaches the pretreatment mechanism 44 and stops, another carriage 30 bearing pretreated semiconductor devices 26 arrives at the stamping mechanism 46 and stops. Then, the detector 104 detects such arrival and stop of the carriage 30, and the positioning mechanism 100 sets the carriages 30 in the predetermined position. In response to the detection of a detector (not shown) provided in the pretreatment mechanism 44, on the other hand, the pretreatment mechanism 44 starts operation.

When the torch nozzles 60 are nonoperating, the roller 64 engages the top surface of the roller guide member 66, as shown in FIG. 5, so that the torch nozzles 60 are maintained substantially horizontal. When the operation is started, the motor 74 drives the disc cam 76 to rotate in the direction of the arrow A, thereby rocking the mounting lever 80 in the direction of the arrow B around the support shaft 82. Accordingly, the driving roller 86 mounted on the distal end of the mounting lever 80 biases the guide member 56 in the direction of the arrow C through the driven member 68. In response to such biasing, the position of the roller 64 to engage the roller guide member 66 is transferred from the top surface to the slant end face of the roller guide member 66, so that the holder member 62 rotates in the direction of the arrow D around the support shaft 58. Accompanying such rotation, the torch nozzles 60 fixed to the support shaft 58 and emitting flames from their distal ends also rotate in the direction of the arrow D. The torch nozzles rotate until the holder member 62 abuts against the head portion of the stopper pin 94 of the regulation member 90. Where the holder member 62 is in contact with the head portion of the stopper pin 94, as shown in FIG. 6, the distal end of each torch nozzle 60 faces the delivery-side end portion of its corresponding semiconductor device 26.

Figure 7:
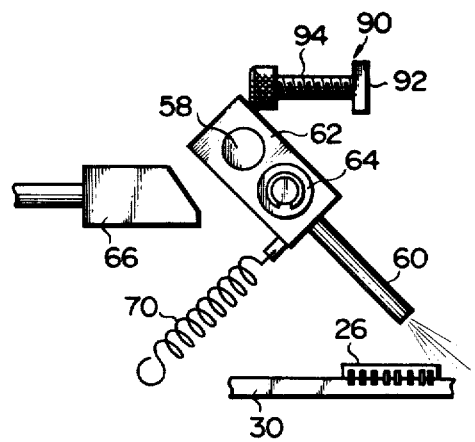

When the disc cam 76 further rotates in the direction of the arrow A, the guide member 56 is further biased in the direction of the arrow C, and the distal end of each torch nozzle 60 moves from the delivery-side end portion of its corresponding semiconductor device 26 to the supply-side end portion along the plastic surface of the device 26. By such movement, the plastic surface of the semiconductor device 26 is roasted in the flame ejected from the distal end of the torch nozzle 60. Thus, oils, fats or mold release agents oozing out of the semiconductor devices 26 are burned and removed.

Where the engaging roller 78 is in contact with that portion of the cam surface of the disc cam 76 which is farthest from the eccentric shaft, the distal end of each torch nozzle 60 faces the supply-side end portion of its corresponding semiconductor device 26 as shown in FIG. 7. When the disc cam 76 rotates from this state further in the direction of the arrow A, the state of FIG. 5 is reached in reverse sequence to the aforementioned operations, that is, via the states of FIGS. 7 and 6 in order. In the state of FIG. 5, the restoration to such state is detected by a detecting switch (not shown), and the drive of the motor 74 is stopped. Namely, the pretreatment mechanism 44 is returned to the nonoperating state.

As is evident from the above description, the flames of the torch nozzles 60 burn the plastics surfaces of the semiconductor devices 26 also in the return stroke, so that oils or fats and mold release agent remaining on the plastics surfaces may be removed securely.

When it is detected that the marking head 98 returns to its upper position, the electric-powered cylinder 106 draws into it the driving shaft 108. Accompanying such withdrawal, the locating lever 110 moves the stopper portions 112 to the position where they do not define the carriage 30 from positioning. As a result, the conveying mechanism 28 starts the drive of the endless chains 36, and the carriages 30 are conveyed.

When the carriage 30 bearing the pretreated semiconductor devices 26 arrives at the stamping mechanism 46, such arrival of the devices 26 is detected again by the detector 104, and the drive of the conveying mechanism 28 is stopped in accordance with the aforementioned processes, as shown in FIGS. 8 and 9. In this stop state, the semiconductor devices 26 are located right under their corresponding rubber stamps 96. When the carriage 30 is set in place by the positioning mechanism 100, the ink roller 114 uniformly covered with ink reciprocates along the direction of the arrow E, as shown in FIG. 8, thereby applying the ink to the rubber stamps 96 mounted on the marking head 98. When the ink roller 114 is returned to its original position, the marking head 98 descends along the direction of an arrow F, and the rubber stamps 96 are caused to abut against the pretreated plastics surfaces of their corresponding semiconductor devices 26. The ink on the rubber stamps 96 are transferred to the plastics surfaces, and thus the mark stamping is finished. When the mark stamping is completed, the marking head 98 is returned to its original position. Such return is detected by a detecting switch (not shown), and ink is newly supplied through the feed roller 116 to the ink roller 114 having finished the application of the ink thereon to the rubber stamps 96.

The carriage 30 bearing the stamped semiconductor devices 26 is moved by the conveying mechanism 28 to reach the fixing mechanism 48. The moment the carriage 30 reaches the fixing mechanism 48, another carriage 30 bearing unstamped semiconductor devices 26 arrives at the stamping mechanism 46. Such arrival at the stamping mechanism 46 is detected by the detector 108, and the drive of the conveying mechanism 28 is stopped. In this state, the stamped semiconductor devices 26 stationarily face the opening 126 of the fixer body 124. Accordingly, the ultraviolet rays from the mercury lamp 128 are applied through the opening 126 to the stamped semiconductor devices 26 for a stoppage time required for the hardening of ink—9 seconds in this embodiment. After such irradiation, the ink starts to harden. Fully hardened during the stoppage time, the ink is fixed on the plastic surfaces of the semiconductor devices 26. After the passage of the predetermined stoppage time, the conveying mechanism 28 starts the drive. Thus, the carriage 30 bearing the marked, that is, pretreated, stamped, and fixed, semiconductor devices 26 is carried to the unloading section 42, and delivered to the next process through the unloading section 42.

In the pretreatment mechanism 44, the angle G (FIG. 6) formed between each operating torch nozzle 60 and the vertical direction can freely be varied between 0° and 60° by advancing or retreating the stopper pin 94 of the regulation member 90. The burning time can freely be set by using a DC motor for the motor 74 and suitably changing the voltage to set freely the rotation speed of the motor. The free setting of the burning time may also be achieved by using an AC motor for the motor 74 and controlling the motor by means of a suitable control circuit to set the rotation speed freely.

It is not necessary that the semiconductor devices on each carriage 30 be disposed separately. For example, these devices may be connected with one another by means of suspension pins. The carriage 30 may be dispensed with if, for example, the lead frame with semiconductor devices suspended from it by suspension pins is moved along the guide rails.

In accordance with the above-described embodiment of the marking apparatus of this invention, a series of marking processes, including pretreatment, stamping and fixing processes, can efficiently be performed in regular succession by using a single conveying mechanism, so that it is possible to ensure rationalized operations and improved productivity. With use of this marking apparatus, therefore, the cost of the semiconductor devices can be reduced.

What we claim is:

1. A marking apparatus for marking at least one plastic encapsulated semiconductor device with marking-obstructive substances thereon comprising a conveying mechanism for conveying the semiconductor device, a pretreatment mechanism for removing the marking-obstructive substances from the top surface of the semiconductor device conveyed thereto by the conveying mechanism, a stamping mechanism for stamping a mark on the semiconductor device having the marking-obstructive substances removed therefrom by the pretreatment mechanism and transferred thereto by the conveying mechanism, and a curing mechanism for curing the mark stamped on the semiconductor device transferred thereto by the conveying mechanism;

said conveying mechanism including endless chains, a plurality of carrying members disposed on the endless chains to move together therewith and conveyed in accordance with the drive of the endless chains, each carrying member bearing at least one semiconductor device, a plurality of feed members attached to the endless chains, each feed member engaging the corresponding carrying member so that the carrying member may be moved by the feed member, and an intermittent drive mechanism for driving carrying members and stopping carrying members at positions where the carrying members severally face the pretreatment mechanism, the stamping mechanism, and the curing mechanism;

said pretreatment mechanism including torch nozzles severally facing the semiconductor devices and emitting flames from their respective distal ends, a support mechanism for rotatably supporting the torch nozzles between a first position where the distal ends of the torch nozzles face their corresponding semiconductor devices and a second position where the distal ends do not face the semiconductor devices, and a driving mechanism for driving the torch nozzles to rotate between the first and second positions, the distal ends of each torch nozzle facing the top surface of each corresponding semiconductor device when the torch nozzle is in the first position, and the marking-obstructive substances on the top surface are removed by burning the top surface with a flame from the torch nozzle in the first position, whereby said top surface is pretreated, said driving mechanism moving the distal end of each torch nozzle in the first position along the top surface of each corresponding semiconductor device, whereby the whole area of said top surface is pretreated;

said stamping mechanism including rubber stamps severally facing the semiconductor devices and inked correspondingly to the marks and an abutment mechanism for causing the rubber stamps to abut against their corresponding pretreated semiconductor devices, whereby stamping is achieved by transferring ink attached to the rubber stamps to their corresponding pretreated semiconductor devices, said ink being formed of a material which is hardened by ultraviolet rays; and said curing mechanism being provided with a lamp emitting ultraviolet rays.

2. The marking apparatus of claim 1 wherein said feed members are arranged at regular intervals, and the intervals between the pretreatment mechanism and the stamping mechanism, and between the stamping mechanism and the curing mechanism, are an integral multiple of the interval between the adjacent feed members.

3. The marking apparatus of claim 1 wherein the flames emitted from the distal ends of the torch nozzles are formed as a result of combustion of hydrogen gas.

* * * * *